United States Patent
Forrest et al.

(10) Patent No.: US 12,227,831 B2
(45) Date of Patent: Feb. 18, 2025

(54) PNEUMATIC SHUTTERS TO CONTROL ORGANIC VAPOR JET PRINTING

(71) Applicant: The Regents of the University of Michigan, Ann Arbor, MI (US)

(72) Inventors: Stephen R. Forrest, Ann Arbor, MI (US); Jeffrey A. Horowitz, Ann Arbor, MI (US)

(73) Assignee: The Regents of the University of Michigan, Innovation Partnerships, Ann Arbor, MI (US)

( * ) Notice: Subject to any disclaimer, the term of this patent is extended or adjusted under 35 U.S.C. 154(b) by 932 days.

(21) Appl. No.: 17/235,232

(22) Filed: Apr. 20, 2021

(65) Prior Publication Data
US 2021/0343941 A1    Nov. 4, 2021

Related U.S. Application Data

(60) Provisional application No. 63/018,719, filed on May 1, 2020.

(51) Int. Cl.
| | |
|---|---|
| *H01L 51/00* | (2006.01) |
| *B05D 1/02* | (2006.01) |
| *C23C 14/12* | (2006.01) |
| *C23C 14/22* | (2006.01) |
| *C23C 16/00* | (2006.01) |

(Continued)

(52) U.S. Cl.
CPC ............... *C23C 14/228* (2013.01); *B05D 1/02* (2013.01); *C23C 14/12* (2013.01); *C23C 16/00* (2013.01); *C23C 14/042* (2013.01); *H10K 71/00* (2023.02)

(58) Field of Classification Search
CPC ........ H01K 71/16; C23C 14/04; C23C 14/12; C23C 14/228; C23C 14/042
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |
| 5,703,436 A | 12/1997 | Forrest |

(Continued)

FOREIGN PATENT DOCUMENTS

| | | |
|---|---|---|
| CN | 102112313 A | 6/2011 |
| CN | 110620061 A | 12/2019 |

(Continued)

OTHER PUBLICATIONS

Baldo et al. Highly efficient phosphorescent emission from organic electroluminescent devices, Nature, vol. 395, pp. 151-154, 1998.

(Continued)

*Primary Examiner* — Joseph A Miller, Jr.
(74) *Attorney, Agent, or Firm* — Butzel Long

(57) ABSTRACT

Devices, systems, and techniques are provided for improved OVJP deposition using a shutter disposed within the OVJP print head, between the print head inlet and the nozzle outlets. An OVJP print head as disclosed includes an inlet for organic material entrained in a carrier gas, a micronozzle array outlet, and a shutter disposed in the gas flow path between the inlet and the micronozzle array outlet. The shutter allows for rapid cutoff of carrier gas flow through the print head with extremely low latency.

20 Claims, 10 Drawing Sheets

(51) Int. Cl.
  *C23C 14/04* (2006.01)
  *H10K 71/00* (2023.01)

(56) References Cited

U.S. PATENT DOCUMENTS

| | | | |
|---|---|---|---|
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2001/0022107 | A1* | 9/2001 | Kato ............... G01C 19/5719 73/504.12 |
| 2003/0230980 | A1 | 12/2003 | Forrest |
| 2004/0174116 | A1 | 9/2004 | Lu |
| 2009/0317547 | A1* | 12/2009 | Strangman ......... C23C 16/4485 118/710 |
| 2011/0095098 | A1 | 4/2011 | Schneider |
| 2017/0229663 | A1 | 8/2017 | Tsai |
| 2019/0305224 | A1 | 10/2019 | Hack |
| 2020/0024733 | A1* | 1/2020 | Bulovic ............... C23C 14/243 |
| 2020/0303645 | A1 | 9/2020 | Forrest |

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Yun et al., "Digital-Mode Organic Vapor-Jet Printing (D-OVJP): Advanced Jet-on-Demand Control of Organic Thin-Film Deposition", Advanced Materials, 2012, 24, 2857-2862.

Chinese Office Action issued in App. No. CN202110492088.3, dated Oct. 10, 2023, 6 pages.

Chinese Office Action issued in App. No. CN202110492088.3, dated Apr. 12, 2024, 6 pages.

* cited by examiner

FIG. 8

| 707 |  |  |
| 708 |  |  |
| 709 |  |  |
| 710 |  |  |
| 711 |  |  |

PNEUMATIC SHUTTERS TO CONTROL ORGANIC VAPOR JET PRINTING

CROSS-REFERENCE TO RELATED APPLICATIONS

This application claims the benefit of U.S. Provisional Patent Application Ser. No. 63/018,719, filed May 1, 2020, the entire contents of which are incorporated herein by reference.

FIELD

The present invention relates to devices and techniques for fabricating organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue"

layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321] |

-continued

| Color | CIE Shape Parameters |
|---|---|
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

BRIEF DESCRIPTION OF THE DRAWINGS

FIG. 8 shows an example of the operation of a shutter as shown in FIGS. 3 and 4.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
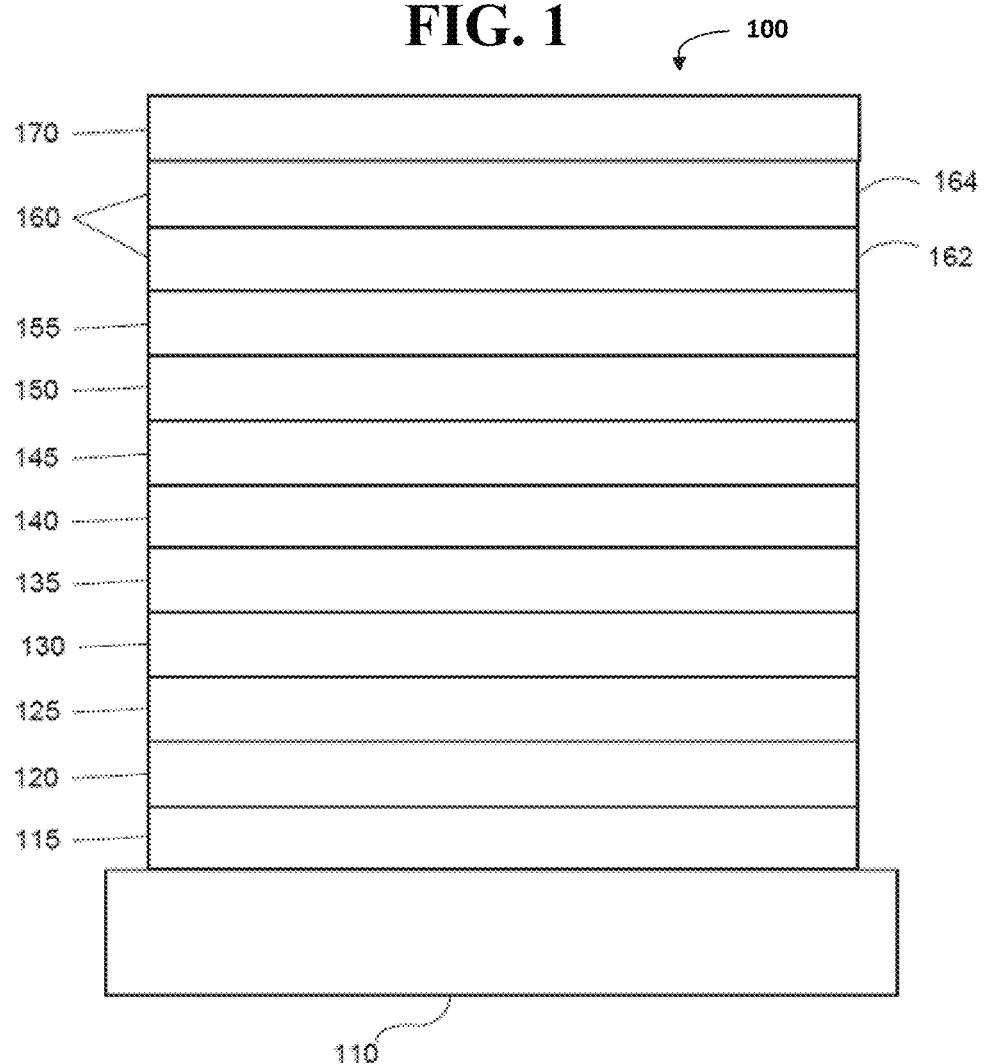
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
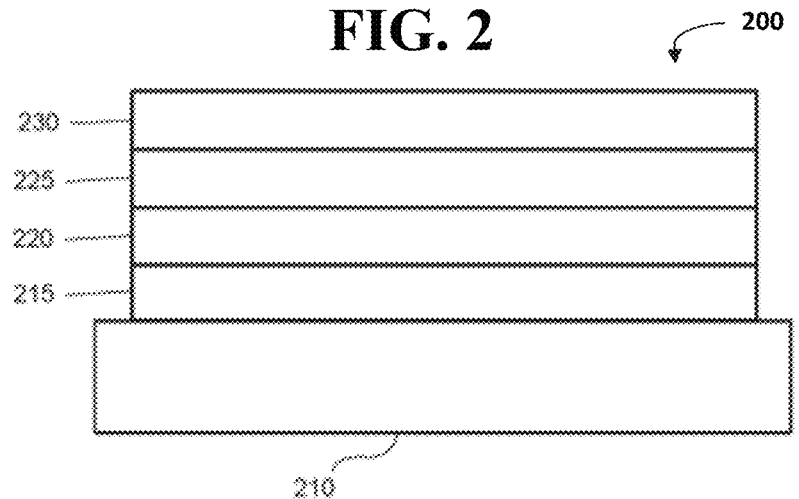
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, a tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, one class of fabrication techniques for OLEDs and components of OLEDs as described above is organic vapor jet printing (OVJP), which generally allows for deposition of small-molecule organic materials at a micron-level resolution. OVJP techniques and devices may be used to fabricate any of the OLED layers and components previously disclosed, up to and including complete OLED devices.

Typical OVJP systems operate by entraining evaporated organic material in a stream of an inert carrier gas, such as $N_2$, and channeling this gas to a print head. The print head directs a stream of the carrier gas and entrained materials toward a substrate, where the materials are deposited on the substrate. An OVJP print head often contains fluidic channels machined into metal and may be attached to a nozzle or nozzle array, such as an array of tapered silicon micronozzles. A relatively short distance below the micronozzle array, a cooled substrate is placed on a moveable stage in a high vacuum. The moveable stage allows the OVJP nozzle array to be positioned over a desired area of the substrate to allow for precise deposition.

As the organic-carrier stream flows out of the nozzle array, the carrier gas accelerates away perpendicular to the surface while the organic material sticks to the substrate, allowing for precise deposition at a very rapid rate. Given the speed and precision with which OVJP can deposit organic materials, previous applications of OVJP have included OLED lighting and displays.

More recently OVJP has been considered for use in the deposition of adhesion points for cellular engineering. Due to the exactness needed for these and similar applications, it has been found that there is a need for OVJP techniques and systems to allow for the fact that organic material can continue to deposit even after the gas flow has been shut off. To address these and other desired features of OVJP-type systems, embodiments disclosed herein may be used to deposit OVJP and similar materials at a scale suitable for fabrication of pixels for mobile and larger-scale displays. OVJP print heads disclosed herein may use micronozzles having a maximum aperture width of 100 µm, 50 µm, 40 µm, or smaller, allowing for printing of features having maximum horizontal dimensions (i.e., measured across the surface of the substrate) of about 500 µm, 400 µm, 300 µm, or less. Furthermore, OVJP print heads disclosed herein may use materials and configurations suitable for processing organic materials used to fabricate OLEDs and similar devices, which may require the ability to process gasses and entrained materials at temperatures up to and greater than 100 C.

Embodiments disclosed herein include shutter arrangements, such as pneumatic and pneumatic-electromechanical shuttering techniques and systems, that may be used to cut-off the gas flow from the OVJP print head. Adding a shutter to the OVJP system as disclosed herein may allow for more precise control of the deposition amount. Conventional OVJP systems typically operate by turning off carrier gas flow at the source of carrier gas. Doing so without use of the shuttering techniques as disclosed herein still allows for leakage through the nozzle array, for example due to pressure equalization between the interior and exterior of the nozzle array. Therefore, it may be desirable to use methods and systems as disclosed herein that to sharply cut off output of the OVJP print head, which aids the reliable fabrication of organic electronic devices as well as for organic adhesion points for cell-growth. Because in some cases the nozzle array is positioned very close to the substrate for accurate deposition, it may be advantageous to place the shutter on the inside of the print head rather than on the outside surface. Shuttering via an internal mechanism also allows for the entire nozzle array to be shuttered at once rather than just single nozzles in the array.

Figure 3A:
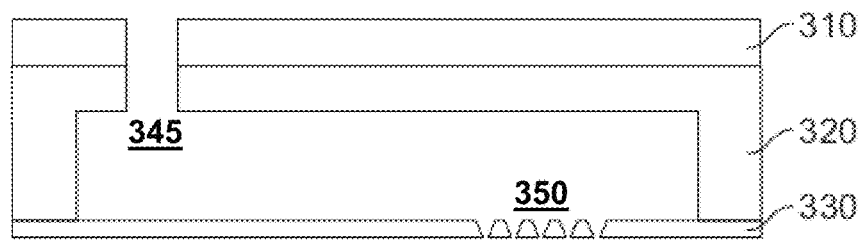
FIG. 3A shows a schematic example of an OVJP print head suitable for use with embodiments disclosed herein.

An OVJP print head typically includes several microfluidic channels which are machined into a metal plate. These channels combine into a single channel from which the evaporated organic material is carried through a silicon micronozzle array. The basic structure of an OVJP print head is shown in FIG. 3A. In this configuration, a nozzle array is fabricated from a silicon wafer and anodically bonded to borosilicate glass. The glass and silicon are then bonded to a metal plate. For example, a metal plate 310 is anodically bonded to borosilicate glass 320 which is anodically bonded to a silicon MEMS micronozzle array 330. The schematic representation shown in FIG. 3 is provided as an example, but other materials and equivalent configurations may be used. A conventional OVJP print head includes one or more inlets 345 through which carrier gas carrying material to be deposited on a substrate may enter the print head before being ejected through a nozzle or nozzle array 350. Embodiments disclosed herein modify the conventional OVJP micronozzle print head by including a shutter disposed between the inlet(s) and the micronozzle array 350, specifically the outlet(s) of the micronozzle array. It may be preferable for the shutter mechanism to be disposed closer to the micronozzle outlet(s) 350 than to the inlet(s) 345 to achieve as low a latency as possible. By positioning the shutter between the inlet 345 and the nozzle outlets 350, embodiments disclosed herein may achieve a much lower latency than is possible with conventional OVJP arrangements that block or otherwise shut off the flow of carrier gas into the OVJP print head (i.e., upstream of the inlet 345). Such low latency cannot be achieved through conventional use of shutoff valves or alternate gas flows, which result in a residual flow of gas into the OVJP print head when the upstream valve is closed, even where an alternate exhaust path for in-line gas is available.

Figure 3B:
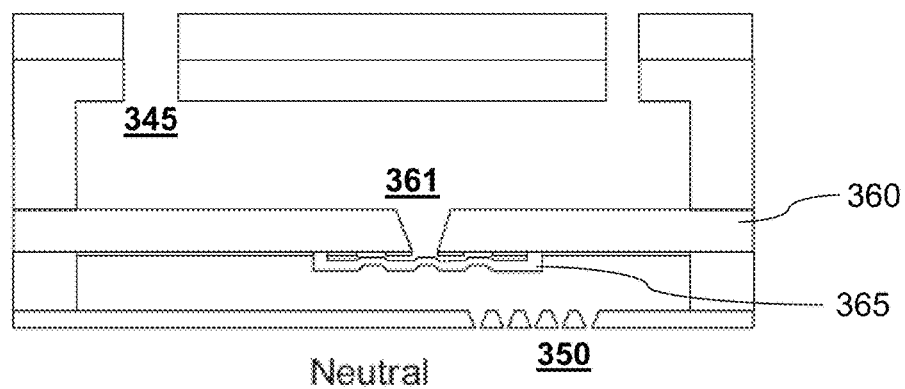
FIG. 3B shows a print head as disclosed herein with a shutter in a neutral position.
Figure 3C:
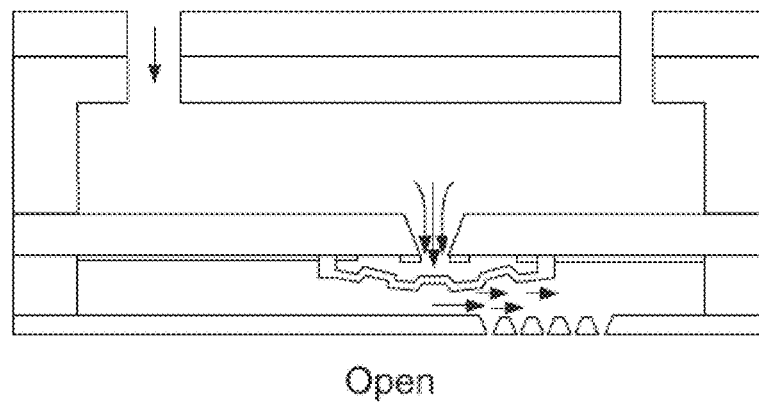
FIG. 3C shows the print head of FIG. 3B with the shutter in an open position.
Figure 3D:
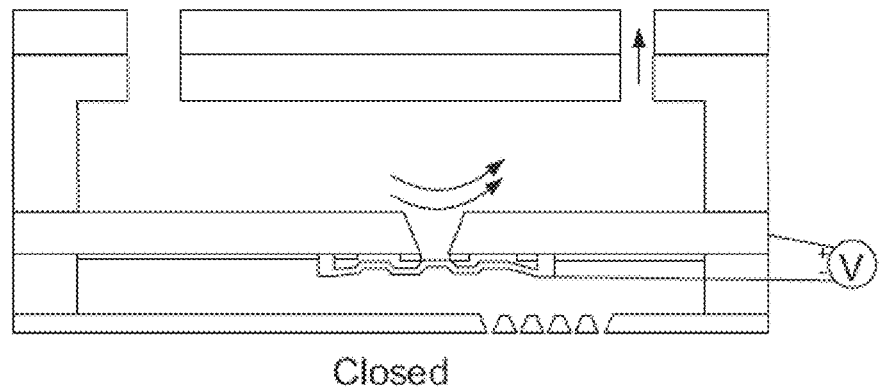
FIG. 3D shows the print head of FIG. 3B with the shutter in a closed position.

FIGS. 3B-3D show an example of an OVJP print head that includes an internal shutter mechanism as disclosed herein. In this arrangement, a bridge 360 including an aperture 361 and a shutter mechanism 365 is disposed within the OVJP print head between the inlet 345 and the micronozzle array 350. For example, a polysilicon bridge may be disposed below a single-crystal silicon substrate with a thin layer of $SiO_2$ between. The shutter/bridge arrangement may be placed between the silicon micronozzle array and the inlet from the metal portion of the print head as shown. In such an arrangement, it may be preferred for the silicon substrate, on which the polysilicon bridge is placed, to be anodically bonded to borosilicate glass (BSG) on the bottom side to connect it to the nozzle array as well as BSG on the top side to connect it to the print head.

Figure 4A:
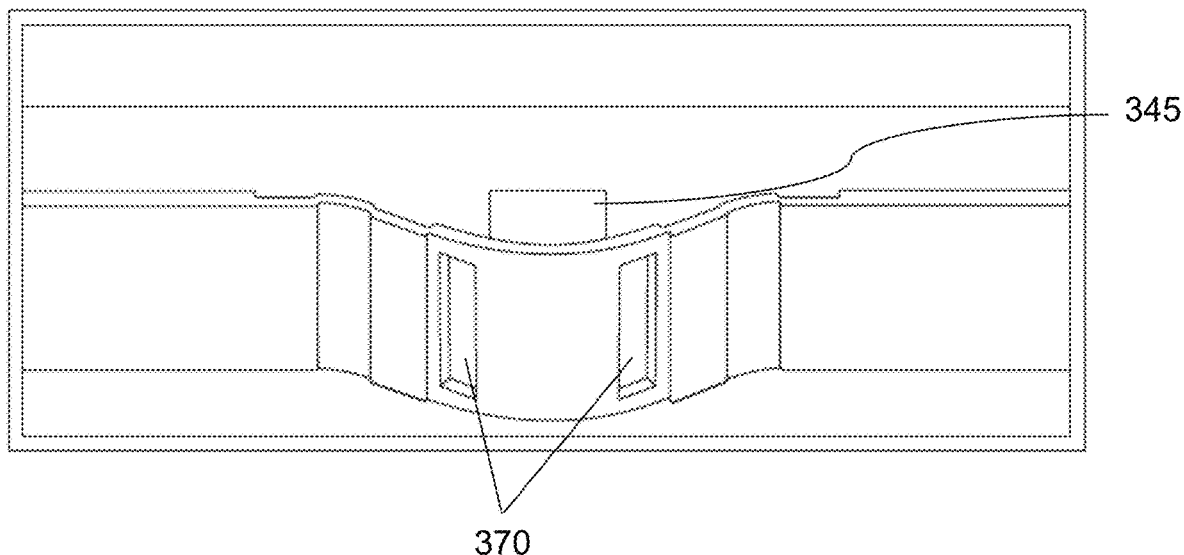
FIG. 4A shows an example of a shutter as disclosed herein in an open position.
Figure 4B:
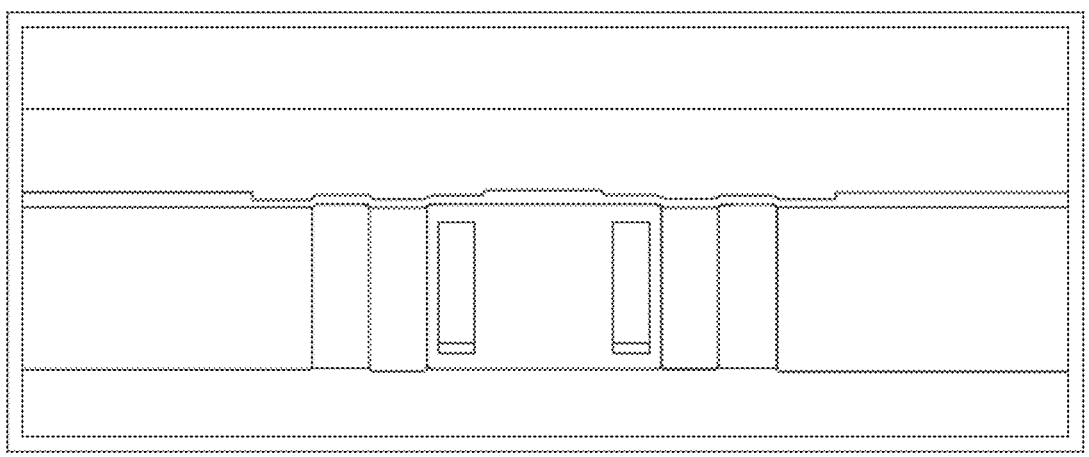
FIG. 4B shows the shutter of FIG. 4A in a closed position.

FIGS. 4A-4B show an enlarged bottom view of the flexible shutter shown in FIGS. 3B-3D. Continuing the example provided with respect to FIGS. 3B-3D, the polysilicon "bridge" portion is disposed below a silicon substrate covering the inlet 345. Gas flows in through the opening in the silicon substrate, pushing the polysilicon bridge to the deformed position as shown in FIG. 4A. From here, gas can flow through the two rectangular openings 370 in the bridge, as well as around the sides of the bridge. With an electrostatic force applied, the shutter moves to the closed position shown in FIG. 4B, blocking flow of gas through the aperture 361 and thereby stopping deposition through the nozzle array.

Returning to FIGS. 3B-3D, FIG. 3B shows an example shutter bridge without any gas flow through the print head. Above the polysilicon bridge, a hole is etched in the silicon substrate as an inlet aperture 361 for the carrier-organic stream to flow through. Between the borosilicate glass and the silicon nozzle array in this example are additional wafers of borosilicate glass and silicon, though other arrangements and materials may be used. Two rectangular openings may be etched into the polysilicon bridge as shown in FIGS. 4A-4B. The openings may be positioned offset from the aperture 361, i.e., such that they are not directly over the inlet aperture. This allows gas to flow to the nozzle array when the bridge is pushed outwards from the aperture, but cuts off gas flow when pulled inwards.

FIGS. 3C-3D show operation of the bridge-type shutter with gas flow through the OVJP print head. Gas flow is shown by the arrows entering via the inlet of the print head and flowing through the inlet aperture of the shutter, and to the array outlet(s) 350. Without any electrostatic potential applied, the incoming gas pressure pushes on the flexible bridge, deforming it outwards into the "open" configuration shown in FIGS. 3C and 4A. In this arrangement, the incoming gas, at a pressure up to 10 kPa, deforms the flexible shutter downwards and gas is allowed to enter the nozzle array through openings in the bridge as well as around the bridge. As previously disclosed, when in the open position there is space between the opening and the rectangular holes in the bridge, as well as space around the sides of the bridge, thus allowing for gas and entrained material to flow to the micronozzle array.

The shutter may be closed by application of a voltage between the silicon substrate and the polysilicon bridge, thus bringing the bridge closed flush on the inlet and preventing any leakage as shown in FIG. 3D. The gas flow is turned off and vacuuming starts through the hole on the right side of the metal plate and glass. A voltage, for example about 150 V, may be applied between the polysilicon bridge and the silicon substrate, causing the bridge to deform closed and preventing any organic material from leaking through. As shown, there may be a layer of $SiO_2$ between the polysilicon shutter and the silicon substrate acting as a dielectric barrier between the silicon and polysilicon electrodes.

Other configurations may use materials other than the polysilicon/silicon bridge given as an example above, which may be closed by application of a voltage, external physical force, or other operation to place the shutter in the closed position shown in FIGS. 3D and 4B. More generally, the flexible shutter arrangement shown in FIGS. 3-4 and 8 may use any suitable material that can react either to the incoming gas flow or to an external force such as an electrical, electromagnetic, physical, or other force to open and/or close the shutter.

Figure 5:
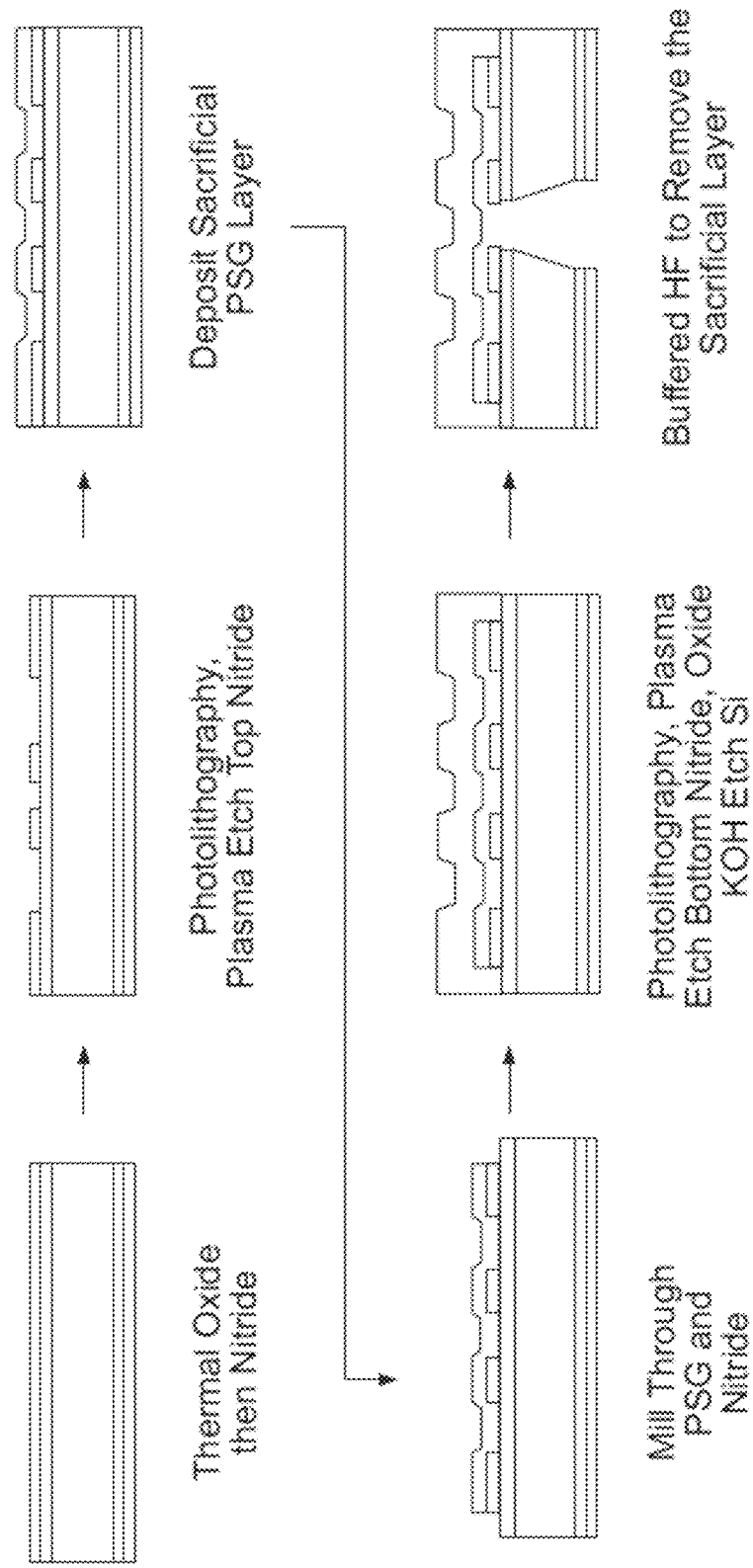
FIG. 5 shows an example fabrication process of a MEMS shutter arrangement such as shown in FIG. 3.

FIG. 5 shows an example fabrication process for a bridge-type shutter as disclosed herein. It will be understood that similar or equivalent techniques may be used to fabricate a polysilicon bridge or other flexible bridge as disclosed herein without departing from the scope of the invention. First, thin layers of thermal oxide and nitride are deposited by low-pressure chemical vapor deposition (LPCVD) onto a wafer of double-polished silicon. Photolithography is performed on one side of the wafer, patterning the outline of the shutter. The nitride is etched and a sacrificial layer of phosphosilicate glass (PSG) is deposited. Photolithography is performed again, and the PSG and nitride are etched on the sides of the structure (bottom left image). Next, polysilicon is deposited to form the shutter and two rectangular openings through the bridge, shown in FIG. 4, are etched. Lithography is performed on the opposite side of the wafer and a hole is etched through to the oxide layer. Finally, buffered HF is used to remove the PSG layer, resulting in a flexible polysilicon bridge such as the examples shown in FIGS. 3-4.

Figure 8:
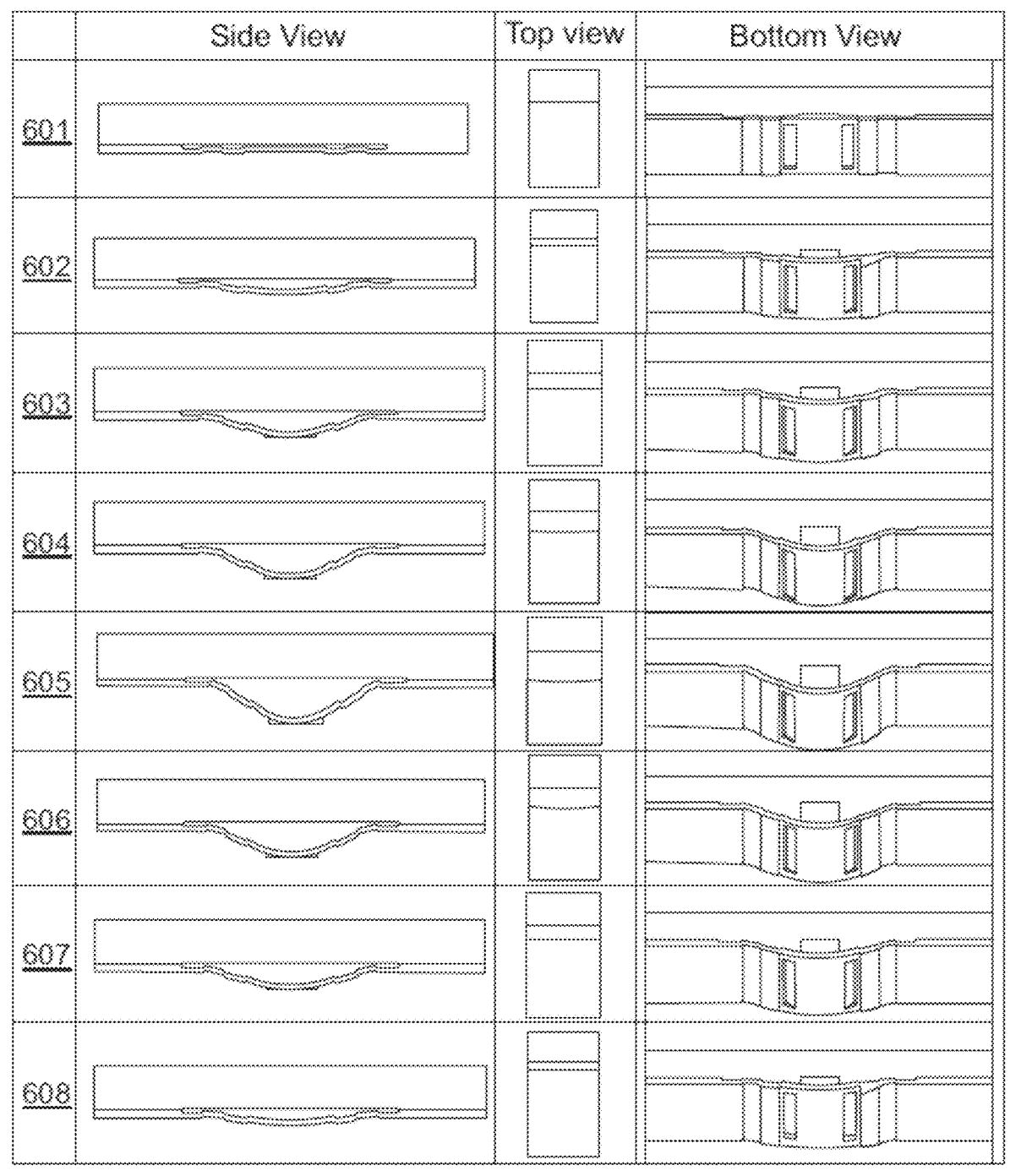

A frame-by-frame view of the movement of a flexible shutter is shown in FIG. 8, in time sequence from 601 to 608 in order. In this example, a bendable polysilicon bridge covers the aperture connecting the organic-carrier gas flow to the nozzle array. The shutter is in a closed position at 601. As downward-moving gas or an externally-applied force deforms the shutter outwards as shown in 602, 603, 604, and 605, the shutter is increasingly open until reaching a maximum open configuration at 605. An electrostatic or other force may be used to pull the shutter inwards and close off the gas flow, at which point the shutter closes as shown in 607 and 608 before returning to the original closed position shown at 601. The shutter may open and close relatively quickly, for example in fractions of a second, thereby allowing for very rapid shutoff of gas flow through the micronozzle outlets.

As previously disclosed, other shutter arrangements may be used that include different physical components and/or different opening and closing mechanisms. In another configuration, the design may be entirely pneumatically controlled, with a movable portion sliding to the side to open or close an aperture. In this arrangement the moveable part may be machined in the metal portion of the print head and therefore does not require silicon microfabrication or similar techniques, while still allowing the shutter to be placed between the print head inlet and the micronozzle outlet(s). Two-dimensional drawings of this design are given in FIG. 6 and three-dimensional drawings are shown in FIG. 7. By applying gas pressure to either side of the structure, the moveable structure slides over the inlet to allow or disallow perpendicular gas flow to enter the nozzle array.

Figure 6A:
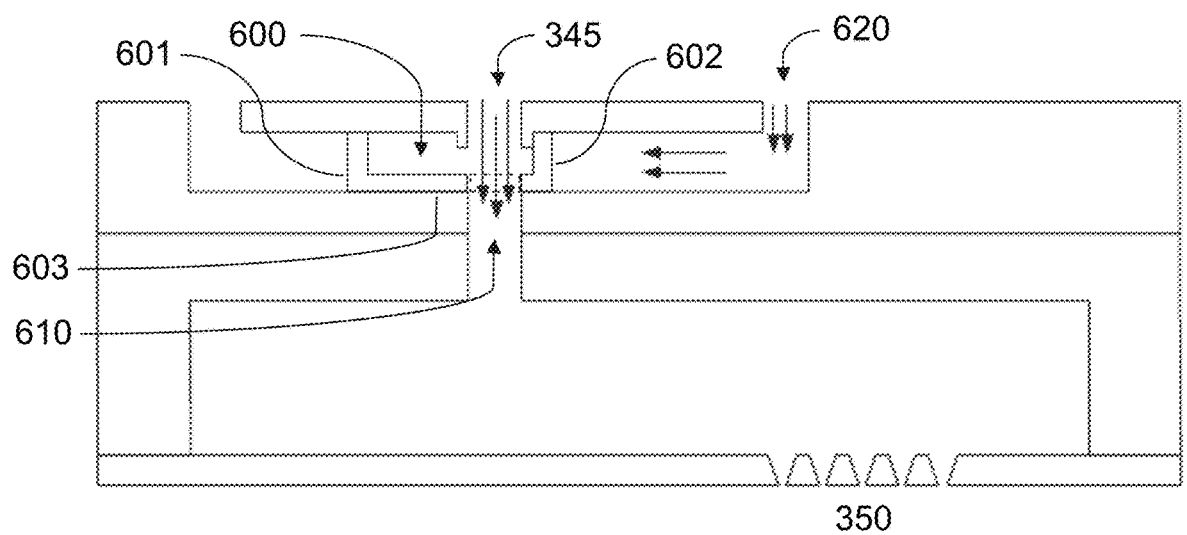
FIGS. 6A-6B show a schematic illustration of a shutter as disclosed herein which includes a moveable part, for example manufactured out of a hard metal, situated within the metal plate with one separate fluidic channel on each side.
Figure 6B:
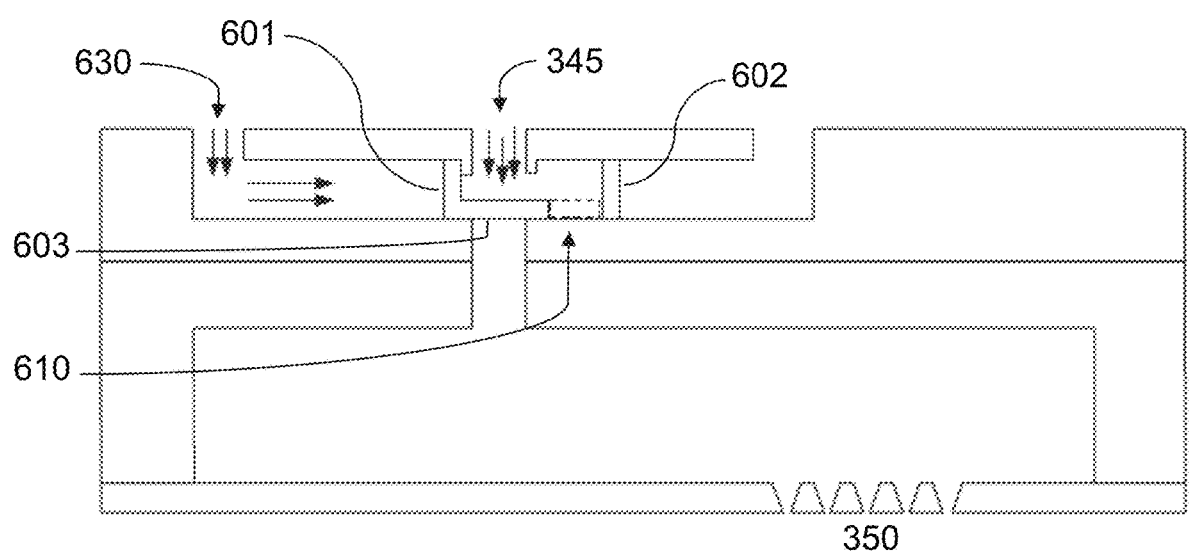

Referring to FIGS. 6A-6B, a mechanical shutter 600 is disposed between the OVJP print head inlet 345 and the micronozzle array outlets 350 as previously disclosed. Arrows show the flow of carrier gas through the print head inlet 345 and the flow of shutter-controlling gas through shutter apertures 620, 630. The shutter includes two side walls 601, 602 connected by a central bottom portion 603. The bottom portion 603 includes an aperture 610 through which the carrier gas flows when the aperture is aligned with the OVJP print head inlet 345. In this example the shutter 600 moves to the left when gas enters via the right shutter inlet 601, and moves to the right when gas enters via the left shutter inlet 602 due to pressure exerted by the gas on the shutter mechanism. The gas used to control the shutter may be any inert gas including the carrier gas, though commonly a separate gas source may be used. FIG. 6A shows the shutter 600 in an open configuration, i.e., where the aperture of the shutter is fully aligned with the print head inlet 345 such that carrier gas flows freely through the inlet 345, through the shutter aperture 610, and to the micronozzle outlets 350. To position the shutter in the open configuration, gas may be directed through one or more shutter inlets 620 as shown, to push the shutter mechanism to the left. Alternatively, any suitable physical, electrical, electromagnetic, pneumatic, or other actuation mechanism may be used to move the shutter into the open configuration.

FIG. 6B shows the same shutter arrangement as FIG. 6A, with the shutter in the closed configuration, i.e., the shutter aperture 610 is not aligned with the print head aperture 345 such that no carrier gas can flow through the shutter aperture and thus the carrier gas is prevented from flowing through the print head to the nozzle outlets 350. To position the shutter in the open configuration, gas may be directed through one or more shutter inlets 630 as shown, to push the shutter mechanism to the left. Alternatively, any suitable physical, electrical, electromagnetic, pneumatic, or other actuation mechanism may be used to move the shutter into the closed configuration.

Figure 7A:
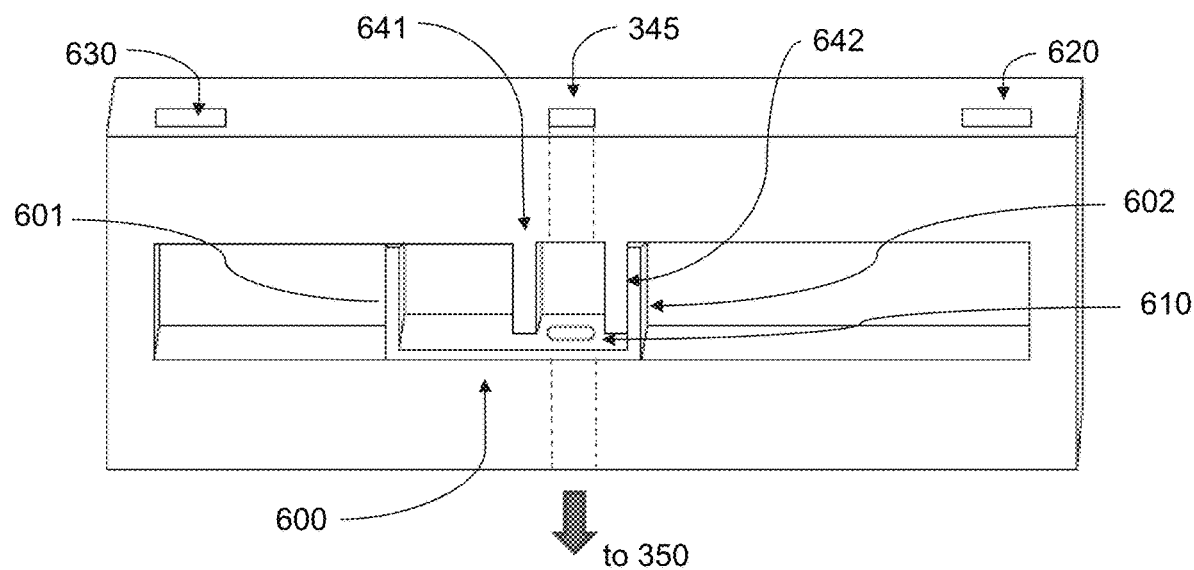
FIGS. 7A-7B show another arrangement of a shutter as shown in FIGS. 6A-6B in the open configuration (FIG. 7A) and the closed configuration (FIG. 7B).
Figure 7B:
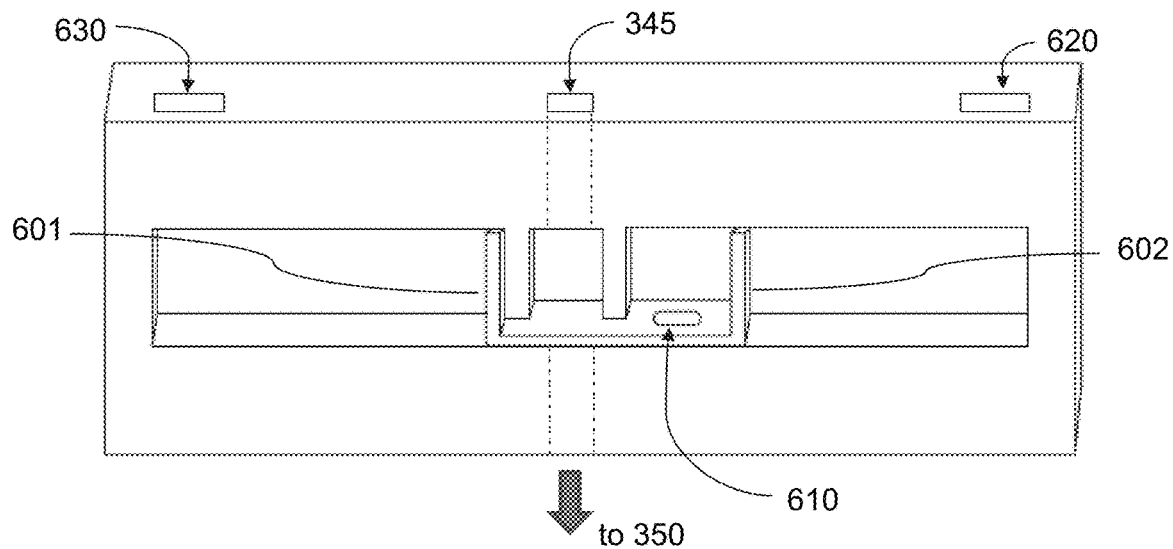

FIGS. 7A-7B show a close-up view of a physical/pneumatic shutter as shown in FIGS. 6A-6B, with like reference numerals denoting like-functioning components. As with the arrangement shown in FIGS. 6A-6B, the shutter 600 may move side-to-side upon application of a suitable force, such as a pressurized gas flowing through the shutter inlets 620, 630 to push the shutter in the opposite direction. Flow paths for the carrier gas through the OVJP print head via the inlet 345 and to the micronozzle outlets (not shown) are shown in dashed lines through the print head block. When the shutter aperture 610 is aligned with the print head inlet 345 as shown in FIG. 7A, carrier gas may flow through the print head to be ejected from the print head nozzles as usual. When the shutter aperture is not aligned with the inlet 345 as shown in FIG. 7B, carrier gas is prevented from flowing through the print head and no material is ejected from the nozzles.

As previously disclosed, the shutter 610 may be actuated with a variety of techniques other than the pressurized gas shown. For example, the shutter may be moved from side to side using mechanical, magnetic, electrical, electromagnetic, or any other suitable means. Stops 641, 642 may be used to prevent the moveable shutter mechanism 600 from moving past the maximum desired positions, which may correspond to fully open and fully closed configurations. One or more exhausts (not shown), which may be controlled by thin film shutters or other structures, may allow for removal of the gas used to move the shutter mechanism 600 between cycles of the shutter. In contrast to exhausts used in conventional OVJP systems, such exhausts are not used to remove excess material ejected by the print head or to remove material still in the carrier gas lines, but rather are only used to remove the gas used to move the shutter. In embodiments that do not use pressurized gas to move a mechanical shutter, exhausts may be altered or omitted. For example, where the shutter mechanism is moved via an electromechanical switch, no exhausts are needed.

Figure 9A:
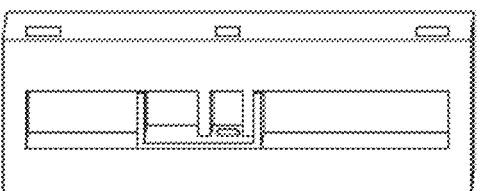
FIGS. 9A, 9B, and 9C show an example of the operation of a shutter as shown in FIGS. 6 and 7.
Figure 9B:
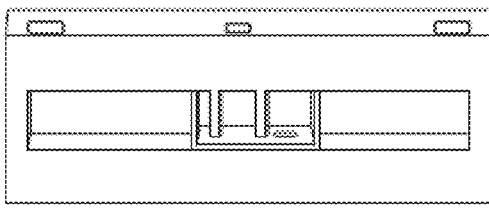
Figure 9B:
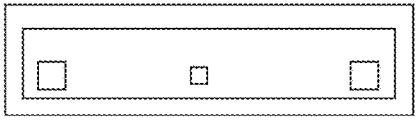
Figure 9B:
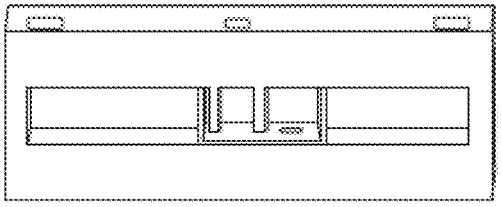
Figure 9B:
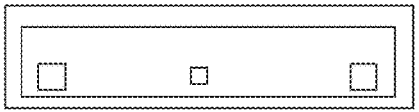
Figure 9B:
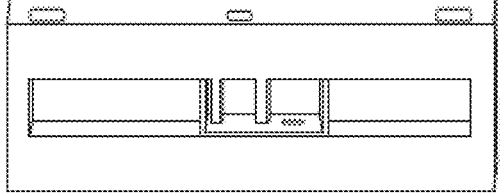
Figure 9B:
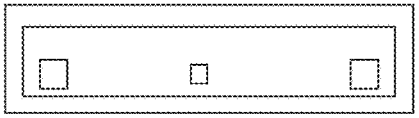
Figure 9B:
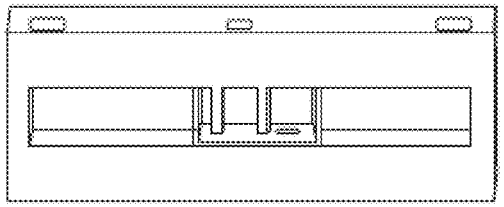
Figure 9B:
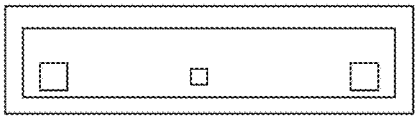
Figure 9B:
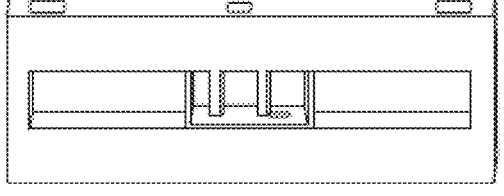
Figure 9B:
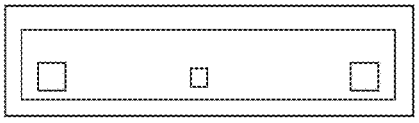
Figure 9C:
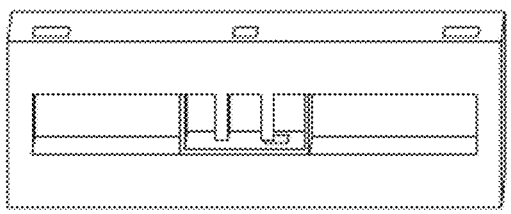

FIGS. 9A-9C show the movement of such a device, as seen from the side and top (left and right columns, respectively). The drawings are ordered in time sequence, showing the movement of the device from 701 to 715. As shown, in this arrangement each of the shutter inlets and the print head inlet have their gas flow individually controlled. The structure pictured lies above the silicon OVJP micronozzle array with the middle channel connecting to the array, i.e., allowing the flow of carrier gas through the print head to the micronozzle outlets as previously disclosed. At 701, the shutter is in the open configuration and allows carrier gas to flow through the print head. At 702, 703, 704, 705, 706, 707, 708, $N_2$ or another suitable gas enters through the left shutter aperture to push the shutter to the right, thereby closing the shutter and preventing gas from flowing through the print head as previously disclosed. At 709, 710, 711, 712, 713, 714, 715, gas enters via the right shutter aperture to push the moveable part leftward, opening the shutter and resulting in a fully-open configuration 701.

Although two examples of specific shutter mechanisms are provided above, it will be understood that any suitable shutter mechanism may be used without departing from the scope or content of the present disclosure. An OVJP print head as disclosed herein may include one or more actuators to move the shutter from the open configuration to the closed configuration and/or vice-versa, which also may be any suitable type of mechanism. For example, the actuator may be an electrical, magnetic, electromagnetic, pneumatic, and/ or physical actuator, as long as it is capable of causing the shutter to assume one of the open or closed configurations disclosed herein. The shutter may include other sealing mechanisms as well, such as a gasket, magnetic lock, or the like, to assist in rapid shut-off of carrier gas through the print head. In some configurations the shutter may be controlled by an automated or semi-automated controller that controls other aspects of operation of the OVJP print head to allow for more precise synchronization of printing. For example, positioning of the print head over a substrate may be controlled by a computerized controller that automatically aligns the print head with a desired portion of the substrate on which material is to be deposited. The same controller may be used to control the shutter, such as via one or more actuators, thereby synchronizing operation of the shutter with other control parameters of the OVJP system as a whole.

An OVJP shutter as disclosed herein may be an integral, single-piece device, though it may be fabricated from multiple components that form an integral component once assembled. For example, the flexible shutter mechanism shown in FIGS. 3-4 is a single, integrated component, though it may be fabricated from multiple layers and materials as previously disclosed. Similarly, the pneumatic shutter mechanism shown in FIGS. 6-7 is provided by a single-piece integral component that is controllable via changes to gas pressure as previously disclosed. The use of an integral shutter mechanism may be desirable compared to more complicated mechanisms that require multiple components operating in tandem to interrupt or stop the carrier gas flow to reduce complexity and chance of failure of the shutter.

OVJP shutters as disclosed herein may be disposed directly in the carrier gas flow, between the carrier gas inlet(s) to the OVJP print head and the OVJP nozzle(s), as previously shown and described. Such a configuration is advantageous over alternate configurations that use diverting gas flow paths or alternate side cutoffs due to decreased latency and simplicity of the arrangement. Since the shutter is arranged directly in the flow path, carrier gas flow through the OVJP print head ceases essentially as soon as the shutter is closed, without the need for the system to wait for carrier gas to process through the print head or to be removed via purge ports or the like. Alternate gas flow paths also require additional heating, cleaning, and other maintenance to address potential condensation of entrained material when the carrier gas flows through and/or is stopped in the alternate flow paths. In contrast, embodiments disclosed herein do not rely on alternate gas lines or other conduits that require separate maintenance.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) deposition device, comprising:
an OVJP print head comprising:
a micronozzle array comprising at least one inlet through which organic material entrained in a carrier gas enters the micronozzle array and a plurality of nozzle outlets through which material is ejected from the micronozzle array; and
a shutter comprising a movable structure having an aperture and disposed between the plurality of nozzle outlets and the inlet, wherein the shutter is movable from an open configuration in which the aperture is aligned with the inlet and a closed configuration in which the aperture is not aligned with the inlet, wherein the shutter allows gas flow into the plurality of nozzle outlets in the open configuration and prevents gas flow into the plurality of nozzle outlets in the closed configuration.

2. The OVJP deposition device of claim 1, wherein the shutter is disposed closer to the nozzle outlets than to the at least one inlet.

3. The OVJP deposition device of claim 1, further comprising an actuator that causes the shutter to change from the open configuration to the closed configuration.

4. The OVJP deposition device of claim 3, wherein the actuator comprises a mechanism type selected from the group consisting of: electrical, magnetic, electromagnetic, pneumatic, and physical.

5. The OVJP deposition device of claim 1, further comprising a first shutter inlet disposed proximal to a first end of the movable structure and a second shutter inlet disposed proximal to a second end of the movable structure.

6. The OVJP deposition device of claim 5, wherein the shutter is moved toward the second shutter inlet when gas flows through the first shutter inlet and exerts pressure on the first wall; and the shutter is moved toward the first shutter inlet when gas flows through the second shutter inlet and exerts pressure on the second wall.

7. The OVJP deposition device of claim 1, wherein applying a first electrical signal to the shutter causes the shutter to be in the closed configuration.

8. The OVJP deposition device of claim 7, wherein applying a second electrical signal to the shutter causes the shutter to be in the open configuration.

9. The OVJP deposition device of claim 1, further comprising:
an organic material source comprising an organic material to be deposited by the print head on a substrate; and
a source of carrier gas in fluid communication with the organic material source and with the at least one inlet.

10. The OVJP deposition device of claim 1, wherein the micronozzle array is fabricated from a monolithic block of material.

11. An OVJP deposition device, comprising:
an OVJP print head comprising:
a micronozzle array comprising at least one inlet through which organic material entrained in a carrier gas enters the micronozzle array and a plurality of nozzle outlets through which material is ejected from the micronozzle array; and
a shutter disposed between the plurality of nozzle outlets and the inlet and having an open configuration and a closed configuration, wherein the shutter allows gas flow into the plurality of nozzle outlets in the open configuration and prevents gas flow into the plurality of nozzle outlets in the closed configuration;
wherein the shutter comprises a flexible bridge portion that flexes toward the plurality of nozzle openings in the open configuration.

12. The OVJP deposition device of claim 11, wherein the shutter is configured to be in the open configuration when gas flows into the OVJP print head at a pressure above a threshold pressure.

13. The OVJP deposition device of claim 12, wherein the shutter is configured to be in the open configuration when an electrical signal is applied to the shutter.

14. The OVJP deposition device of claim 12, wherein the threshold pressure is 10 kPa.

15. The OVJP deposition device of claim 11, further comprising:
an organic material source comprising an organic material to be deposited by the print head on a substrate; and
a source of carrier gas in fluid communication with the organic material source and with the at least one inlet.

16. An OVJP deposition device, comprising:
an OVJP print head comprising:
a micronozzle array comprising at least one inlet through which organic material entrained in a carrier gas enters the micronozzle array and a plurality of nozzle outlets through which material is ejected from the micronozzle array; and
a shutter disposed between the plurality of nozzle outlets and the inlet and having an open configuration and a closed configuration, wherein the shutter allows gas flow into the plurality of nozzle outlets in the open configuration and prevents gas flow into the plurality of nozzle outlets in the closed configuration;
wherein the shutter comprises a polysilicon bridge and a single-crystal silicon substrate.

17. The OVJP deposition device of claim 16, wherein the shutter further comprises a layer of $SiO_2$ disposed between the polysilicon bridge and the single-crystal silicon substrate.

18. The OVJP deposition device of claim 16, wherein the polysilicon bridge comprises one or more openings offset from the inlet which allow gas to flow to the plurality of nozzle outlets when the shutter is in the open position.

19. The OVJP deposition device of claim 16, further comprising:
an organic material source comprising an organic material to be deposited by the print head on a substrate; and
a source of carrier gas in fluid communication with the organic material source and with the at least one inlet.

20. The OVJP deposition device of claim 16, wherein applying a first electrical signal to the shutter causes the shutter to be in the closed configuration.

* * * * *